United States Patent
Ebrahimzadeh

(10) Patent No.: US 10,491,025 B1
(45) Date of Patent: Nov. 26, 2019

(54) APPARATUS, SYSTEMS, AND METHODS FOR PULSE CHARGING RECHARGEABLE BATTERIES

(71) Applicant: Facebook, Inc., Menlo Park, CA (US)

(72) Inventor: Soheil Ebrahimzadeh, San Francisco, CA (US)

(73) Assignee: Facebook, Inc., Menlo Park, CA (US)

( * ) Notice: Subject to any disclaimer, the term of this patent is extended or adjusted under 35 U.S.C. 154(b) by 43 days.

(21) Appl. No.: 15/654,553

(22) Filed: Jul. 19, 2017

(51) Int. Cl.
*H02J 7/00* (2006.01)
*H01M 10/44* (2006.01)
*G01R 31/392* (2019.01)

(52) U.S. Cl.
CPC .......... *H02J 7/0093* (2013.01); *G01R 31/392* (2019.01); *H01M 10/44* (2013.01)

(58) Field of Classification Search
CPC .... H02J 7/0093; G01R 31/3679; H01M 10/44
See application file for complete search history.

(56) References Cited

U.S. PATENT DOCUMENTS

| | | | |
|---|---|---|---|
| 9,348,390 B2 | 5/2016 | Du et al. | |
| 9,891,685 B1* | 2/2018 | Marr | G06F 1/30 |
| 2009/0066295 A1* | 3/2009 | Takeno | H02J 7/0093 320/145 |
| 2011/0304211 A1* | 12/2011 | Peterson | G06F 1/263 307/48 |
| 2015/0377971 A1 | 12/2015 | Keating et al. | |
| 2016/0116548 A1* | 4/2016 | Ghantous | H01M 10/44 702/63 |
| 2016/0266979 A1 | 9/2016 | Glover et al. | |
| 2017/0093207 A1 | 3/2017 | Park et al. | |

OTHER PUBLICATIONS

Open Rack Standard V2.0; http://files.opencompute.org/oc/public.php?service=files&t=1088a8d608fb48fd46828af3fdf9a861, Jan. 17, 2017.
Soheil Ebrahimzadeh et al.; Apparatus, Systems, and Methods for Pulse Charging Rechargeable Batteries; U.S. Appl. No. 15/654,553, filed Jul. 19, 2017.

* cited by examiner

*Primary Examiner* — Nha T Nguyen
(74) *Attorney, Agent, or Firm* — FisherBroyles, LLP

(57) ABSTRACT

A computer-implemented method for pulse charging rechargeable batteries may include (1) identifying a rechargeable battery, (2) estimating an age of the rechargeable battery, (3) calculating, based at least in part on the age of the rechargeable battery, a pulse parameter for pulse charging the rechargeable battery, and (4) pulse charging the rechargeable battery using the pulse parameter to prolong the useful life of the rechargeable battery. In some examples, the rechargeable battery may be a backup battery that supplies backup power to a power supply within a datacenter rack. Various other methods, systems, and apparatus are also disclosed.

20 Claims, 7 Drawing Sheets

Parameter Lookup Table
172

| AGE | PULSE-ON DURATION | PULSE-OFF DURATION |
|---|---|---|
| 36 Months | 700 ms | 3 ms |
| 48 Months | 650 ms | 9 ms |
| 60 Months | 600 ms | 17 ms |
| 72 Months | 550 ms | 26 ms |

FIG. 6

APPARATUS, SYSTEMS, AND METHODS FOR PULSE CHARGING RECHARGEABLE BATTERIES

BACKGROUND

Many of today's computing systems are powered by power sources that are not always reliable. In some instances, a power supply of a computing system, like those found in a typical data center, may periodically transition to auxiliary power sources when primary power sources experience disruptions. For example, in a typical data center, computing systems are generally powered by mains power but may periodically transition to auxiliary generators during mains-power disruptions. After primary power sources are restored, an additional transition generally must occur back to the primary power sources from auxiliary power sources. During transitions between primary and auxiliary power sources, a power supply may not receive power from either power source. While transitions between primary and auxiliary power sources may be quick, commonly occurring in seconds or a few minutes, these transitions are typically not instantaneous.

Because of the non-instantaneous transitions between primary and auxiliary power sources, typical computer-system power supplies generally rely on backup batteries to supply power during the transitions. Unfortunately, most batteries have limited lifespans, which are generally far shorter than the lifespans of the power supplies to which they supply backup power. As a result, backup batteries may limit the lifespans of the power supplies or must be replaced to ensure that the power supplies deliver uninterrupted power. Additionally, to ensure that backup batteries of power supplies perform their designed role, backup batteries may need to be replaced long before the ends of their expected lifespans.

A typical battery charger may charge a depleted rechargeable battery by applying a constant current to the rechargeable battery until the voltage of the rechargeable battery reaches a predetermined threshold, after which the battery charger may apply a constant voltage to the rechargeable battery until the rechargeable battery is fully charged, which may maximize the available charge of the rechargeable battery and/or the amount of time between a full charge of the rechargeable battery and a full discharge of the rechargeable battery. Unfortunately, this method of charging batteries may unnecessarily reduce the lifespan of batteries in certain circumstances. For example in some situations, charging a rechargeable battery using a constant current or voltage may (1) cause the rechargeable battery to heat up, which may reduce the lifespan of the rechargeable battery over time, and/or (2) prevent ions of the rechargeable battery from properly diffusing into the negative electrode of the rechargeable battery, which may reduce the capacity and/or the lifespan of the rechargeable battery as it ages. The instant disclosure, therefore, identifies and addresses a need for apparatus, systems, and methods that prolong the expected lifespans of batteries, especially backup batteries of power supplies.

SUMMARY

As will be described in greater detail below, the instant disclosure describes various systems and methods for pulse charging rechargeable batteries (e.g., batteries of power supplies that are used for backup power during short transitions between the power supplies' primary and auxiliary power sources) using current and/or voltage pulses with age-based characteristics. In one example, a method for pulse charging rechargeable batteries may include (1) identifying a rechargeable battery, (2) estimating an age of the rechargeable battery, (3) calculating, based at least in part on the age of the rechargeable battery, a pulse parameter for pulse charging the rechargeable battery, and (4) pulse charging the rechargeable battery using the pulse parameter to prolong the useful life of the rechargeable battery.

In some examples, the pulse parameter may include (1) a pulse duration for which current should be applied to the rechargeable battery, (2) a pulse duration for which current should not be applied to the rechargeable battery, (3) a pulse frequency, (4) a pulse shape, (5) a pulse amplitude, (6) a voltage threshold at which pulse charging of the rechargeable battery should start, and/or (7) a voltage threshold at which pulse charging of the rechargeable battery should end. In some examples, the step of estimating the age of the rechargeable battery may include using a nominal capacity of the rechargeable battery and/or a measured capacity of the rechargeable battery that was measured when the rechargeable battery was manufactured to estimate the age of the rechargeable battery. Additionally or alternatively, the step of estimating the age of the rechargeable battery may include (1) measuring a present capacity of the rechargeable battery and (2) using the present capacity of the rechargeable battery to estimate the age of the rechargeable battery.

In some examples, the computer-implemented method may further include (1) estimating, at a subsequent point in time, an updated age of the rechargeable battery, (2) updating, based at least in part on the updated age of the rechargeable battery, the pulse parameter for pulse charging the rechargeable battery, and (3) pulse charging the rechargeable battery using the pulse parameter to further prolong the useful life of the rechargeable battery. In at least one example, the rechargeable battery may include a backup battery that supplies backup power to a power supply within a data-center rack, and the rechargeable battery may be a lithium-ion battery.

In addition, a corresponding battery charging system for pulse charging rechargeable batteries may include several modules stored in memory, including (1) an identifying module that identifies a rechargeable battery, (2) an estimating module that estimates an age of the rechargeable battery, (3) a calculating module that calculates, based at least in part on the age of the rechargeable battery, a pulse parameter for pulse charging the rechargeable battery, and (4) a charging module that pulse charges the rechargeable battery using the pulse parameter to prolong the useful life of the rechargeable battery. In some examples the battery charging system may also include at least one processor that executes the identifying module, the estimating module, the calculating module, and the charging module.

In some examples, the estimating module may estimate the age of the rechargeable battery based on a nominal capacity of the rechargeable battery and/or a measured capacity of the rechargeable battery that was measured when the rechargeable battery was manufactured. Additionally or alternatively, the estimating module may estimate the age of the rechargeable battery by measuring a present capacity of the rechargeable battery and using the present capacity of the rechargeable battery to estimate the age of the rechargeable battery. In at least one example, the battery charging system may further include a register that is accessible to a battery charger, and the charging module may pulse charge the rechargeable battery using the pulse parameter by (1) writing a value indicating the pulse parameter to the register and (2) issuing a command to the battery charger to charge the rechargeable battery. In this example, the battery charger may charge the rechargeable battery in response to the command by (1) reading the value indicating the pulse parameter from the register and (2) charging the rechargeable battery pulse parameter using the pulse parameter.

In addition, a rechargeable-battery apparatus for pulse charging rechargeable batteries may include (1) a rechargeable battery and (2) a battery-management subsystem that (a) estimates an age of the rechargeable battery, (b) calculates, based at least in part on the age of the rechargeable battery, a pulse parameter for pulse charging the rechargeable battery, and (c) instructs a battery charger to pulse charge the rechargeable battery using the pulse parameter to prolong the useful life of the rechargeable battery. In at least one example, the rechargeable-battery apparatus may also include a register that is accessible to the battery charger, and the battery-management subsystem may instruct the battery charger to pulse charge the rechargeable battery using the pulse parameter by (1) writing a value indicating the pulse parameter to the register and (2) issuing a command to the battery charger to charge the rechargeable battery. In this example, the battery charger may charge the rechargeable battery in response to the command by (1) reading the value indicating the pulse parameter from the register and (2) pulse charging the rechargeable battery using the pulse parameter.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 6 is a block diagram of an exemplary lookup table for determining suitable pulse parameters for pulse charging rechargeable batteries.

Figure 1:
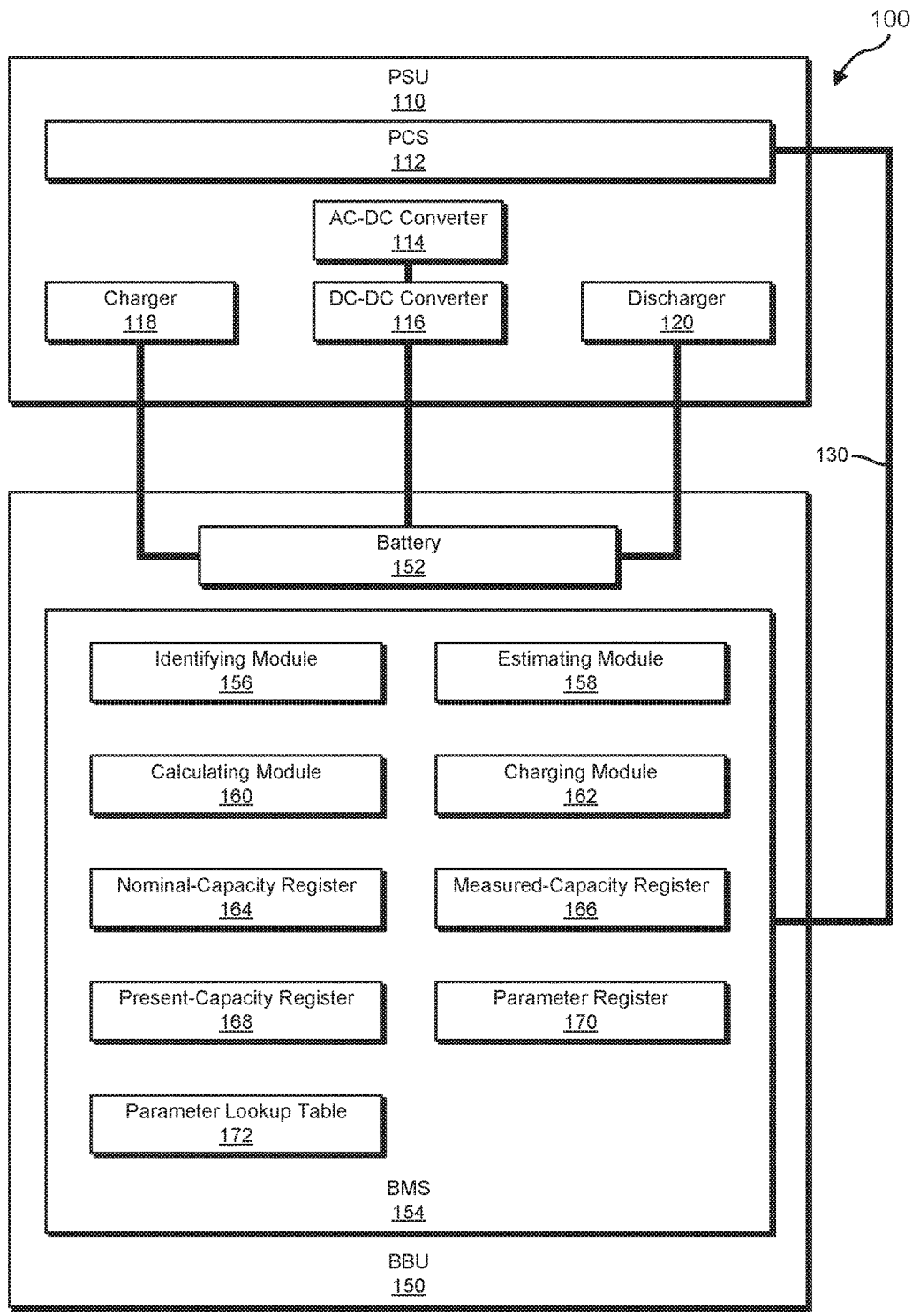
FIG. 1 is a block diagram of an exemplary power-supply system for pulse charging rechargeable batteries.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to systems and methods for pulse charging rechargeable batteries. As will be explained in greater detail below, by pulse charging a rechargeable battery using one or more current or voltage pulses that are dynamically tailored to and/or adjusted for the rechargeable battery's age, the apparatus, systems, and methods described herein may prolong the lifespan of the rechargeable battery and/or improve the capacity of the rechargeable battery. Moreover, by periodically updating the characteristics of these current or voltage pulses based on the rechargeable battery's age, the apparatus, systems, and methods described herein may ensure that the rechargeable battery is always optimally charged. Embodiments of the instant disclosure may also provide various other advantages and features, as discussed in greater detail below.

The following will provide, with reference to FIGS. 1-4 and 7, detailed descriptions of example apparatus and systems for pulse charging rechargeable batteries. Detailed descriptions of corresponding computer-implemented methods will also be provided in connection with FIGS. 5 and 6.

FIG. 1 is a block diagram of an example power-supply system (PSS) 100 for pulse charging rechargeable batteries. As illustrated in this figure, example power-supply system 100 may include a power-supply unit (PSU) 110 and a battery backup unit (BBU) 150 connected via a communication channel 130 (e.g., an analog or digital communication channel such as an Inter-Integrated Circuit ($I^2C$) serial computer bus). As shown in this example, power-supply unit 110 may include a power control system (PCS) 112, an AC-DC converter 114, a DC-DC converter 116, a smart battery charger 118, and a battery discharger 120. Additionally, battery backup unit 150 may include a rechargeable battery 152 and a battery-management system (BMS) 154. As illustrated in FIG. 1, battery-management system 154 may include one or more modules for performing one or more tasks. As will be explained in greater detail below, battery-management system 154 may include an identifying module 156, and estimating module 158, a calculating module 160, and charging module 162. Although illustrated as separate elements, one or more of the modules in FIG. 1 may represent portions of a single module or application. Moreover, while modules 156-162 are illustrated in FIG. 1 as part of battery backup unit 150, in at least some examples, one or more of modules 156-162 may be configured as part of power-supply unit 110.

As illustrated in FIG. 1, battery-management system 154 may also include one or more hardware registers for storing data. Battery-management system 154 may also include a parameter lookup table 172 that maps pulse-charge parameters to battery ages. In at least one example, parameter lookup table 172 may represent a lookup table with values supplied by a battery vendor that indicate, for a particular age of a rechargeable battery, various parameters of the current or voltage charging pulses that should be applied to the rechargeable battery while pulse charging the rechargeable battery.

Figure 2:
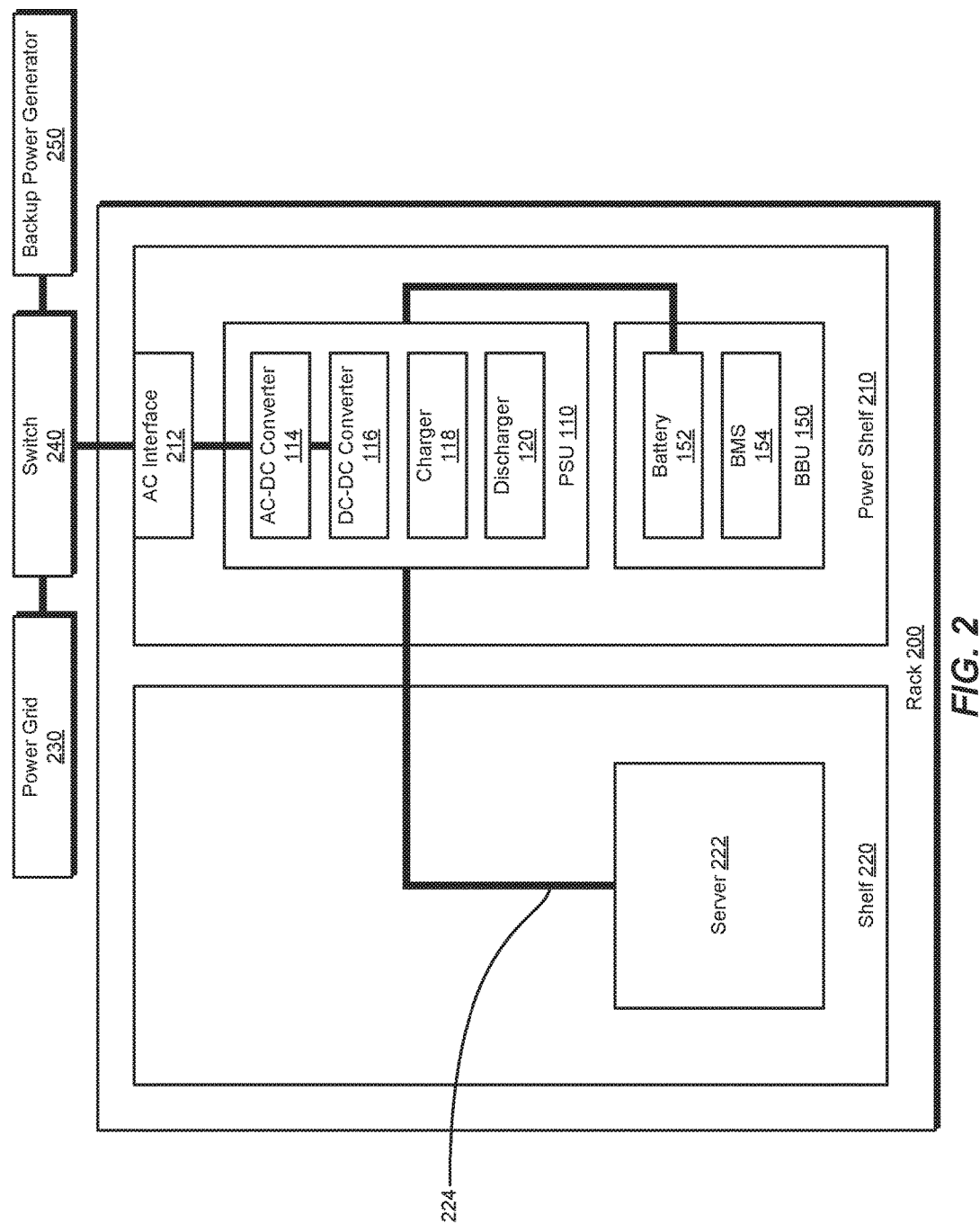
FIG. 2 is a block diagram of an additional exemplary power-supply system for pulse charging rechargeable batteries.

Example power-supply system 100 in FIG. 1 may be implemented and/or configured in a variety of ways. For example, all or a portion of example power-supply system 100 may represent portions of a power shelf of a data-center rack. For example, as shown in FIG. 2, all or a portion of example power-supply system 100 may represent portions of example data-center rack 200 that houses one or more shelves (e.g., a power shelf 210 and a shelf 220). In some examples, power shelf 210 may be capable of providing uninterrupted power to the server computing devices hosted within shelf 220 (e.g., server 222). In the illustrated example, power shelf 210 may include power-supply unit 110 and backup battery unit 150.

Figure 3:
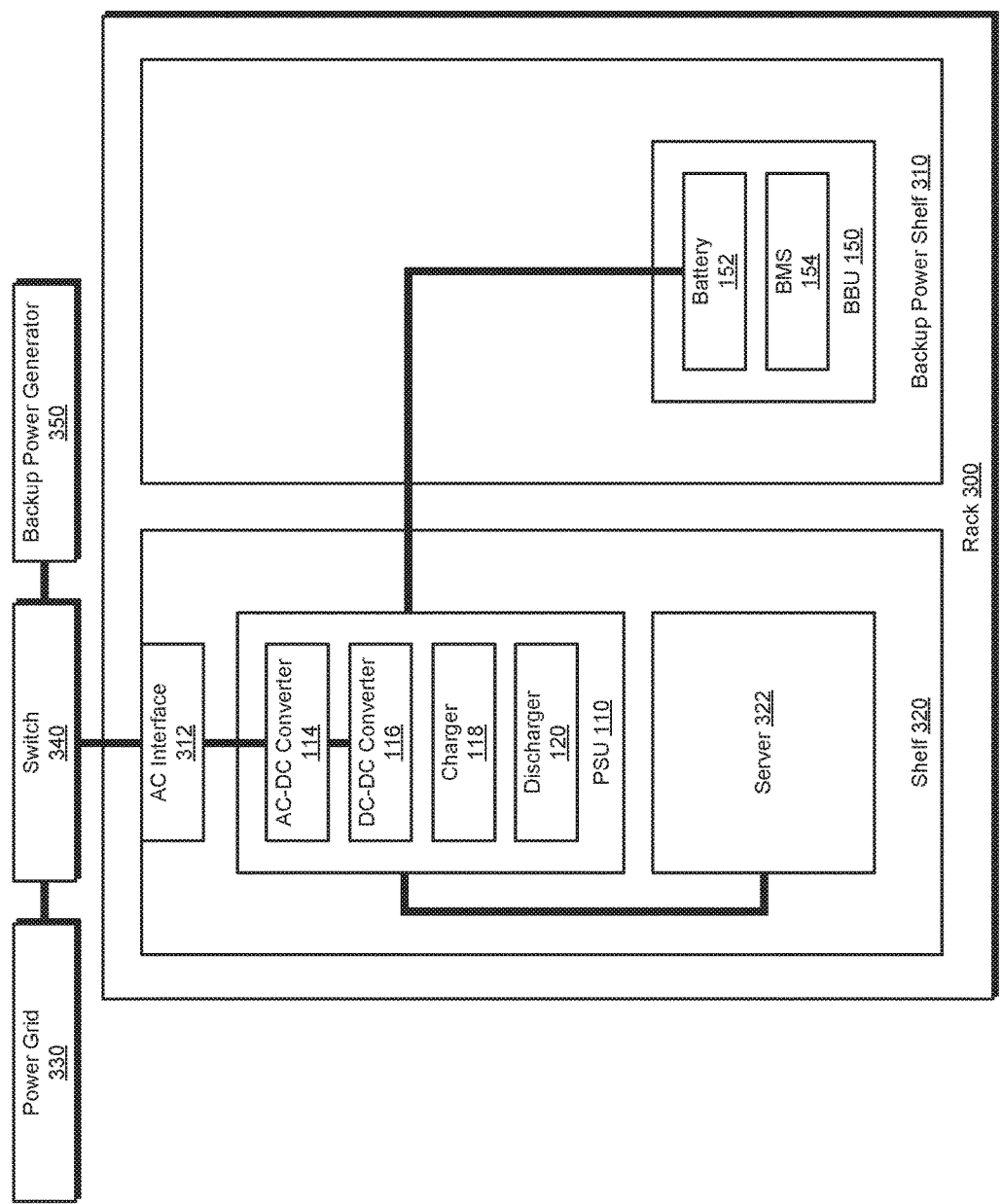
FIG. 3 is a block diagram of an additional exemplary power-supply system for pulse charging rechargeable batteries.

In some examples, portions of example power-supply system 100 may be divided amongst two or more shelves of a data-center rack. For example, as shown in FIG. 3, portions of example power-supply system 100 may represent portions of one or more shelves (e.g., a backup power shelf 310 and a shelf 320) of example data-center rack 300 in FIG. 3. As shown, shelf 320 may include power-supply unit 110. In this example, backup power shelf 310 may include backup battery unit 150 and may be capable of providing backup power to power-supply unit 110, and power-supply unit 110 may provide uninterrupted power to the computing components of shelf 320 (e.g., server 322).

Figure 4:
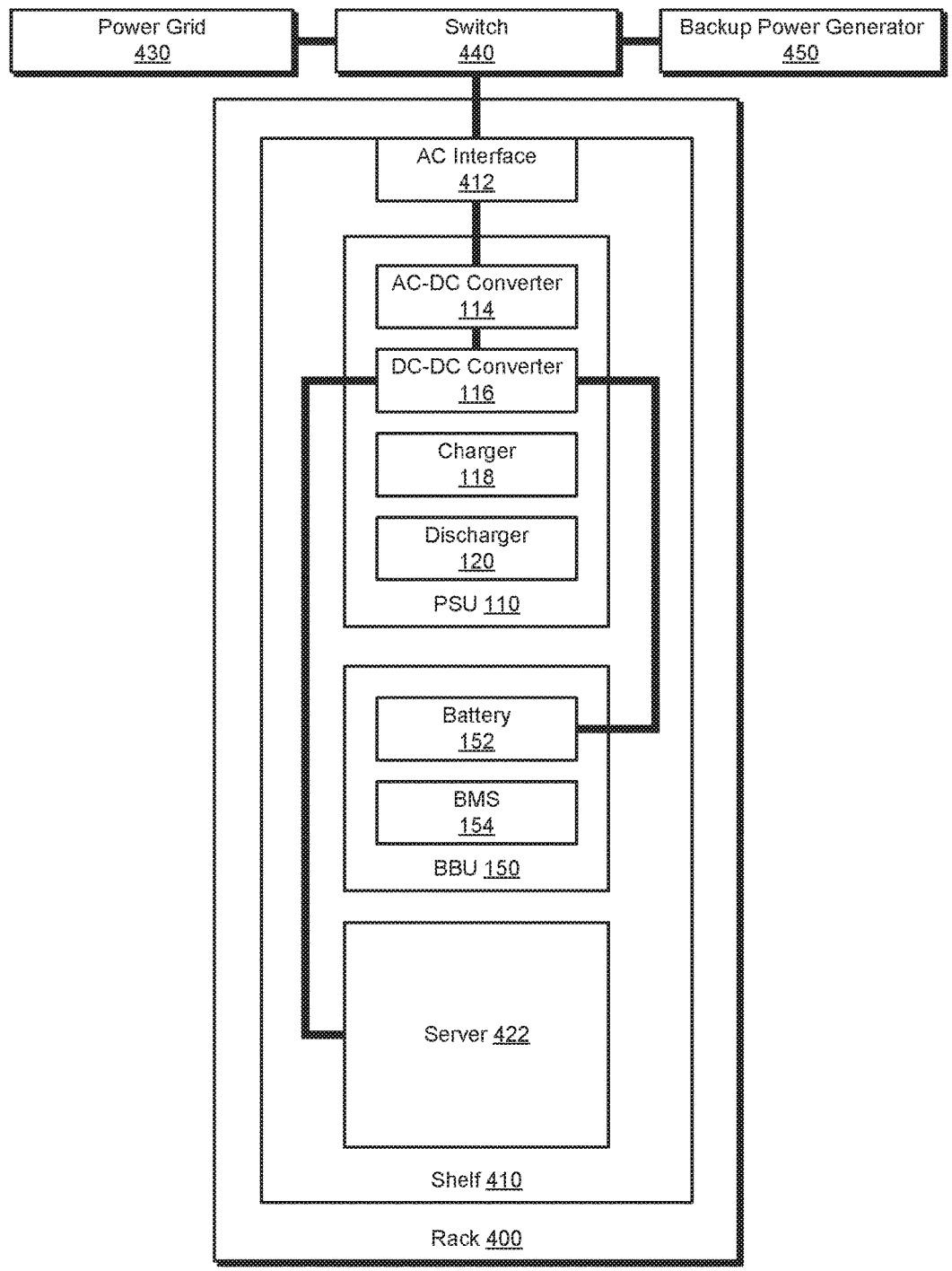
FIG. 4 is a block diagram of an additional exemplary power-supply system for pulse charging rechargeable batteries.

In some examples, all or a portion of example power-supply system 100 may represent portions of a single shelf of a data-center rack that contains both computing components as well as at least one power supply that provides uninterrupted power to the computing components. For example, as shown in FIG. 4, all or a portion of example power-supply system 100 may represent portions of a shelf 410 of example data-center rack 400 in FIG. 4. As shown, shelf 410 may include power-supply unit 110 and backup battery unit 150. In this example, backup battery unit 150 may be capable of providing backup power to power-supply unit 110 that provides uninterrupted power within shelf 410.

Figure 7:
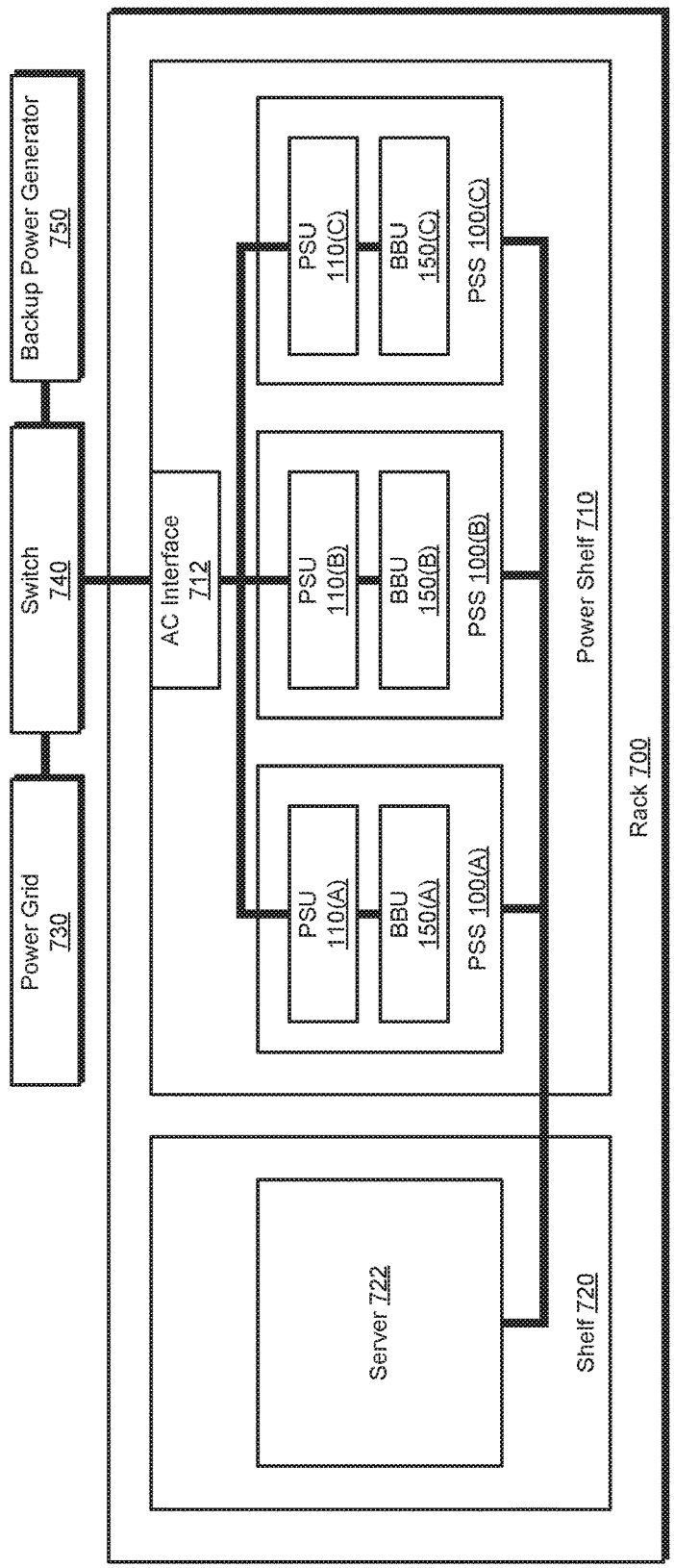
FIG. 7 is a block diagram of an additional exemplary power-supply system for pulse charging rechargeable batteries.

The following is a description of the components illustrated in FIG. 1 as they are implemented and configured in FIG. 2, although the same or similar components and descriptions can be applied to the other examples illustrated in FIGS. 3, 4, and 7. As shown in FIG. 2, data-center rack 200 may include an alternating-current (AC) interface 212. AC interface 212 may receive an alternating current (AC) input from a power grid 230. In some embodiments, the AC input can be three-phase electric power. As indicated above, data-center rack 200 can include at least one power-supply unit 110. In the example illustrated in FIG. 2, power-supply unit 110 may convert the power provided by AC interface 212 to provide a power rail 224 from which computing components housed within the shelves of data-center rack 200 may draw power. In some examples, power-supply unit 110 may include AC-to-DC converter 114 to convert AC input power from AC interface 212 into a DC voltage. In some embodiments, AC-to-DC converter 114 may alternatively be implemented in AC interface 212. In some examples, power-supply unit 110 may also include DC-to-DC converter 116 that converts the DC voltage of AC-to-DC converter 114 to a second DC voltage usable by the electronic components hosted within the shelves of data-center rack 200.

In some examples, when power grid 230 provides uninterrupted power, AC interface 212, power-supply unit 110, and/or other power conversion or delivery components (not illustrated) may provide sufficient power to keep the electronic components within data-center rack 200 operational. However, when a power outage occurs, data-center rack 200 may rely on one or more backup power components. For example, data-center rack 200 may rely on battery backup unit 150 and a backup power generator 250 (e.g., a diesel AC generator). Battery backup unit 150 may include one or more batteries (e.g., battery 152) that may provide enough power to keep the electronic components within data-center rack 200 running for a short period of time (e.g., a few seconds or minutes). Backup power generator 250 on the other hand may provide enough power to keep the electronic components within data-center rack 200 running for a much longer period of time (e.g., multiple minutes or even hours). A power switch 240 may draw AC power from backup power generator 250 when power grid 230 fails to provide sufficient power. However, backup power generator 250 may take some time to become fully operational (e.g., capable of providing stable and uninterrupted power to the electronic components within data-center rack 200). As an example, a diesel backup generator may take a minute or longer before providing stable power. Accordingly, battery backup unit 150 may provide power after power grid 230 fails, but before the backup power generator 250 becomes fully operational. Battery backup unit 150 may also provide power after power grid 230 is restored during a transition back to power provided from power grid 230 from power provided by backup power generator 250.

Although not explicitly illustrated in FIG. 2, data-center rack 200 may include a state-of-health testing system. In some examples, the state-of-health testing system may be a part of battery backup unit 150 and/or may include at least estimating module 158 and calculating module 160. In some examples, the state-of-health testing system may be located outside of battery backup unit 150 (e.g., as a separate component). The state-of-health testing system may perform capacity-degradation testing of battery 152 according to a schedule or based on randomized testing. The capacity-degradation testing may involve discharging a specified amount of energy from battery 152. While the foregoing described the components illustrated in FIG. 2, it is understood that the same are similar descriptions may be applied to the examples illustrated in FIGS. 3, 4, and 7.

Figure 5:
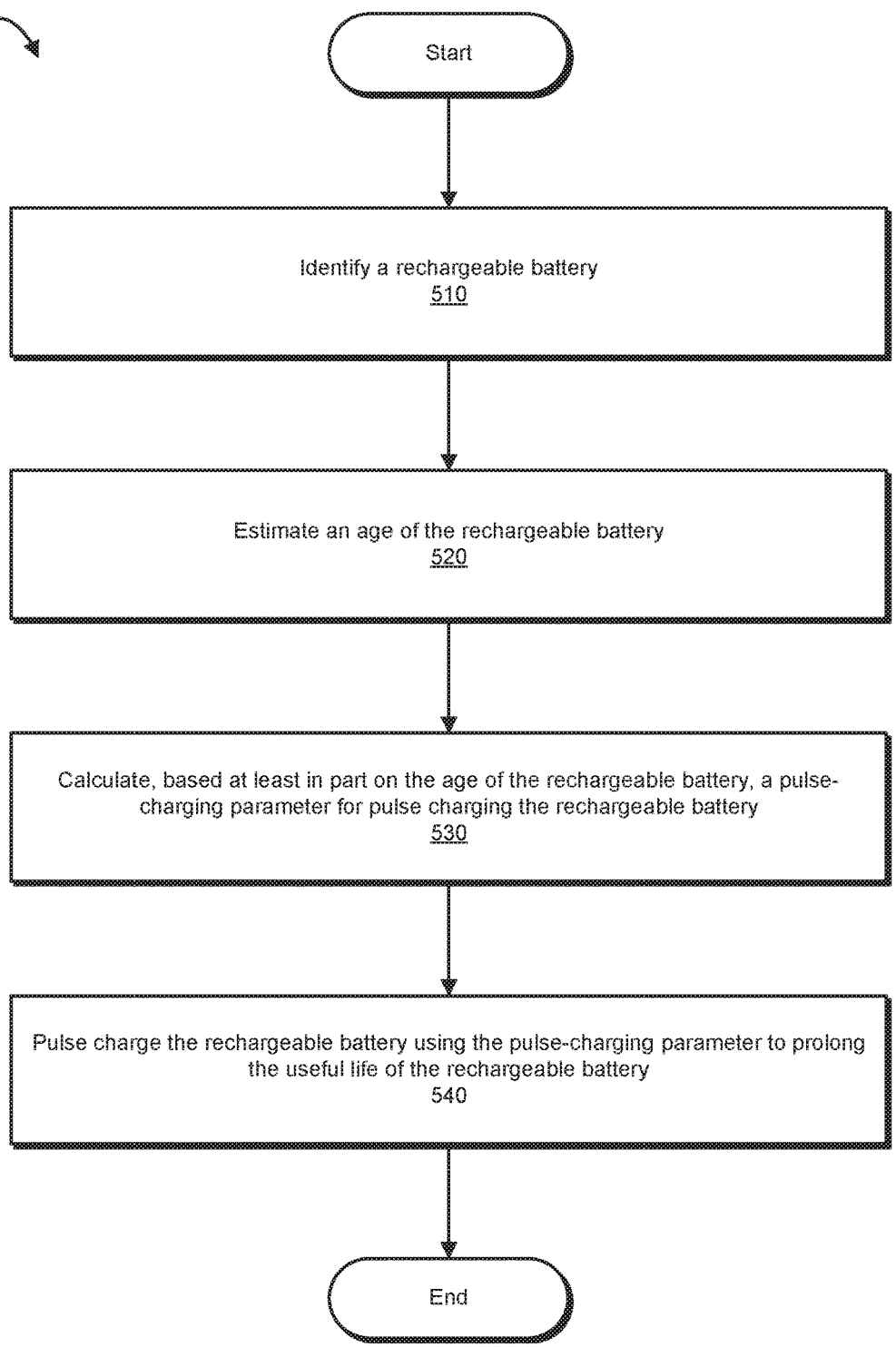
FIG. 5 is a flow diagram of an exemplary method for pulse charging rechargeable batteries.

FIG. 5 is a flow diagram of an example computer-implemented method 500 for pulse charging rechargeable batteries. The steps shown in FIG. 5 may be performed by any suitable computer-executable code and/or computing system, including power-supply system 100 in FIG. 1 and/or variations or combinations of one or more of the same. In one example, each of the steps shown in FIG. 5 may represent an algorithm whose structure includes and/or is represented by multiple sub-steps, examples of which will be provided in greater detail below.

As illustrated in FIG. 5, at step 510, one or more of the apparatus or systems described herein may identify a rechargeable battery. At step 520, one or more of the apparatus or systems described herein may then estimate an age of the rechargeable battery. As used herein, the term "age" generally refers to a measurement or indication of a battery's capacity and/or a measurement or indication of a change to a battery's capacity over time. In some examples, a battery's age may be measured in units of time (e.g., months or days), as percentages of the battery's initial or nominal capacity (e.g., 60% of nominal capacity), a percentage by which the battery's capacity has degraded, and/or any other suitable unit of measure. The term "capacity," as used herein, may refer to a battery's expected or actual available capacity. In some examples, a battery's capacity may represent an amount of electric charge that the battery may deliver at a particular voltage. In some examples, a battery's capacity may be equal to the number of hours for which the battery is able to provide a current that is equal to a particular discharge rate starting from a particular initial voltage (e.g., the battery's nominal voltage).

The apparatus and systems described herein may estimate a rechargeable battery's age in any suitable manner. In general, estimating module 158 may determine a rechargeable battery's age by determining and/or comparing the rechargeable battery's present capacity with a reported or nominal capacity of the rechargeable battery and/or an initial or prior measured capacity of the rechargeable battery (e.g., the rechargeable battery's capacity when the rechargeable battery was manufactured or first put into service). In some examples, estimating module 158 may perform a state-of-health test on a rechargeable battery to determine the present capacity of the rechargeable battery. In some examples, estimating module 158 may write a value indicating a rechargeable battery's present capacity to an associated register. For example, after measuring the present capacity of battery 152, estimating module 158 may store its value to present-capacity register 168.

In some examples, a rechargeable battery may include or be associated with one or more registers that record prior measurements of the rechargeable battery's capacity (e.g., as illustrate in FIG. 1). In these examples, estimating module 158 may determine these capacities by reading their values from these registers. Using FIG. 1 as an example, estimating module 158 may determine a nominal, reported, or advertised capacity of battery 152 by reading its value from nominal-capacity register 164 and a measured capacity of battery 152 by reading its value from measured-capacity register 166. In some examples, a manufacturer may have recorded, when battery 152 was manufactured, the nominal capacity of battery 152 to nominal-capacity register 164 and/or the initial capacity of battery 152 to measured-capacity register 166.

In some examples, the apparatus or systems described herein may need to partially or completely discharge a rechargeable battery that is used to supply backup power to a power supply in order to determine the rechargeable battery's current capacity, which may cause the power supply to be unable to provide uninterrupted power while the current capacity of its rechargeable battery is being measured. For at least this reason, a computing system may be configured with redundant power supplies. FIG. 7 illustrates a data-center rack 700 that includes a power shelf 710 that includes three power-supply units in a 2+1 redundant configuration. In this example, battery backup unit 150(A) may supply backup power to power-supply unit 110(A), battery backup unit 150(B) may supply backup power to power-supply unit 110(B), and battery backup unit 150(C) may supply backup power to power-supply unit 110(C). In this example, the apparatus and systems described herein may alternatingly estimate the ages of the backup batteries of battery backup units 150(A)-(C) so that a sufficient number of power supplies are available to provide needed power to the components contained in data-center rack 700 when power grid 730 experiences a disruption and power-supply units 110(A)-(C) must transition to receiving power from backup power generator 750.

Returning to FIG. 1, at step 530, one or more of the apparatus or systems described herein may calculate, based at least in part on the age of the rechargeable battery, a pulse parameter for pulse charging the rechargeable battery. As used herein, the term "pulse parameter" generally refers to any characteristic of a current or voltage pulse with which a battery charger should charge a rechargeable battery. Examples of pulse parameters include, without limitation, pulse widths, pulse durations (e.g., an amount of time for which a charging or discharging current or a voltage should be applied to a rechargeable battery or an amount of time for which a charging or discharging current or a voltage should not be applied to the rechargeable battery), pulse frequencies, pulse shapes, pulse amplitudes, pulse rise times, pulse fall times, voltage thresholds (e.g., voltage thresholds at which pulse charging of a rechargeable battery using a certain pulse should start or end), and/or any other pulse characteristic.

The apparatus or systems described herein may calculate a pulse parameter for pulse charging a rechargeable battery in any suitable manner. In one example, calculating module 160 may use the age estimated at step 520 to query a lookup table (e.g. parameter lookup table 172 as illustrated in FIG. 6) that contains values (possibly supplied by a battery vendor) that indicate, for a particular age of a rechargeable battery, various pulse parameters that describe the optimal current or voltage charging pulses that should be used to pulse charge the rechargeable battery in order to prolong the lifespan of the rechargeable battery and/or improve or maintain the capacity of the rechargeable battery. Using FIG. 6 as an example, once it has been determined that the age of battery 152 has been determined to be 36 months, calculating module 160 may use this value to query parameter lookup table 172 to determine that battery 152 should be pulse charged using a pulse that is on for 700 milliseconds (ms) and then off for 3 ms. If at a later time the age of battery 152 is determined to be 60 months, calculating module 160 may again query parameter lookup table 172 using this updated age to determine that battery 152 should then be charged using a pulse that is on for 600 ms and then off for 17 ms.

In some examples, after determining a pulse parameter for a rechargeable battery, the apparatus or systems described herein may write a value indicating the pulse parameter to a designated register. For example, after determining a pulse parameter for battery 152, calculating module 160 may write its value to parameter register 170.

Returning to FIG. 1, at step 540, one or more of the apparatus or systems described herein may pulse charge the rechargeable battery using the pulse parameter to prolong the useful life of the rechargeable battery.

The apparatus or systems described herein may pulse charge a rechargeable battery using an identified pulse parameter in any suitable manner. In some examples, the apparatus or systems described herein may include or be a part of a battery charger and may pulse charge a rechargeable battery using an identified pulse parameter by generating a charging pulse that satisfies the pulse parameter and applying the charging pulse to the rechargeable battery.

In some examples, the apparatus or systems described herein may operate independent of a battery charger. In these examples the apparatus or systems described herein may instruct the battery charger to pulse charge a rechargeable battery using a pulse parameter. In one example, the apparatus or systems described herein may instruct a battery charger to pulse charge a rechargeable battery via an analog or digital communication channel. Additionally or alternatively, a rechargeable battery may be associated with a register that may be accessed by a battery charger that may contain a value that indicates a pulse parameter that describes the charging pulse with which the battery charger should pulse charge the rechargeable battery. To instruct the battery charger to charge the rechargeable battery using a particular pulse parameter, the apparatus and systems described herein may write a value indicating the pulse parameter to the register and then instruct the battery charger to charge the rechargeable battery. In this example, the battery charger may access the register in order to determine the pulse parameter that describes the charging pulse with which to charge the rechargeable battery.

Using FIG. 1 as an example, battery backup unit 150 may include parameter register 170 that may be accessible to charger 118 of power-supply unit 110. In this example, a value indicating a pulse parameter may have been written to parameter register 170 at step 530, and charging module 162 may pulse charge battery 152 using this pulse parameter by issuing a command to battery charger 118 to charge battery 152. In this example, in response to receiving the command, battery charger 118 may charge battery 152 by (1) reading the value indicating the pulse parameter from parameter register 170 and (2) applying a charging pulse that satisfies the pulse parameter to battery 152.

In some examples, the apparatus and systems described herein may periodically perform method 500 in order to update the pulse parameter of a rechargeable battery to reflect its current age. The apparatus and systems described herein may perform method 500 at any suitable interval (e.g., once every 90 days).

As described above, by pulse charging a rechargeable battery using one or more current or voltage pulses that are dynamically tailored to and/or adjusted for the rechargeable battery's age, the apparatus, systems, and methods described herein may prolong the lifespan of the rechargeable battery and/or improve the capacity of the rechargeable battery. Moreover, by periodically updating the characteristics of these current or voltage pulses based on the rechargeable battery's age, the apparatus, systems, and methods described herein may ensure that the rechargeable battery is always optimally charged.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

The term "memory device," as used herein, generally represents any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In addition, the term "physical processor," as used herein, generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

The term "computer-readable medium," as used herein, generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A computer-implemented method comprising:
   identifying, by a battery backup unit, a rechargeable battery of the battery backup unit that is used by a power supply system of a data-center rack, wherein:
   the power supply system uses the rechargeable battery to provide backup power to computing components of the data-center rack during non-instantaneous transitions between a primary power source and an auxiliary power source;
   the battery backup unit and the power supply system are separate and distinct systems that are independently controlled;

the power supply system comprises a battery charger; and
a communication channel is established between the battery backup unit and the power supply system;
estimating, by the battery backup unit, an age of the rechargeable battery;
calculating, by the battery backup unit based at least in part on the age of the rechargeable battery, a pulse parameter for pulse charging the rechargeable battery; and
instructing, by the battery backup unit via the communication channel, the battery charger of the power supply system to pulse charge the rechargeable battery using the pulse parameter to prolong the useful life of the rechargeable battery, wherein the pulse parameter is transferred from the battery backup unit to the battery charger of the power supply system via the communication channel.

2. The computer-implemented method of claim 1, wherein:
the battery backup unit comprises a register that is accessible to the battery charger via the communication channel;
instructing the battery charger to pulse charge the rechargeable battery comprises:
writing, by the battery backup unit, a value indicating the pulse parameter to the register; and
issuing, by the battery backup unit via the communication channel, a command to the battery charger to charge the rechargeable battery; and
the battery charger charges the rechargeable battery in response to the command by:
reading, via the communication channel, the value indicating the pulse parameter from the register; and
charging the rechargeable battery using the pulse parameter.

3. The computer-implemented method of claim 1, wherein the pulse parameter comprises at least one of:
a pulse duration for which current should not be applied to the rechargeable battery; or
a pulse duration for which current should be applied to the rechargeable battery.

4. The computer-implemented method of claim 1, wherein the pulse parameter comprises a pulse frequency.

5. The computer-implemented method of claim 1, wherein the pulse parameter comprises a pulse shape.

6. The computer-implemented method of claim 1, wherein the pulse parameter comprises a pulse amplitude.

7. The computer-implemented method of claim 1, wherein the pulse parameter comprises a voltage threshold at which pulse charging of the rechargeable battery should start.

8. The computer-implemented method of claim 1, wherein the pulse parameter comprises a voltage threshold at which pulse charging of the rechargeable battery should end.

9. The computer-implemented method of claim 1, wherein estimating the age of the rechargeable battery comprises using, by the battery backup unit, a nominal capacity of the rechargeable battery to estimate the age of the rechargeable battery.

10. The computer-implemented method of claim 1, wherein:
estimating the age of the rechargeable battery comprises using, by the battery backup unit, a measured capacity of the rechargeable battery to estimate the age of the rechargeable battery; and
the measured capacity of the rechargeable battery was measured when the rechargeable battery was manufactured.

11. The computer-implemented method of claim 1, wherein estimating the age of the rechargeable battery comprises:
measuring, by the battery backup unit, a present capacity of the rechargeable battery; and
using, by the battery backup unit, the present capacity of the rechargeable battery to estimate the age of the rechargeable battery.

12. The computer-implemented method of claim 1, further comprising:
estimating, by the battery backup unit at a subsequent point in time, an updated age of the rechargeable battery;
updating, by the battery backup unit based at least in part on the updated age of the rechargeable battery, the pulse parameter for pulse charging the rechargeable battery; and
reinstructing, by the battery backup unit via the communication channel, the battery charger of the power supply system to pulse charge the rechargeable battery using the pulse parameter to further prolong the useful life of the rechargeable battery.

13. The computer-implemented method of claim 1, wherein the rechargeable battery comprises a lithium-ion battery.

14. A battery-backup system comprising:
a rechargeable battery that is used by a power supply system of a data-center rack, wherein:
the power supply system uses the rechargeable battery to provide backup power to computing components of the data-center rack during non-instantaneous transitions between a primary power source and an auxiliary power source;
the battery-backup system and the power supply system are separate and distinct systems that are independently controlled;
the power supply system comprises a battery charger; and
a communication channel is established between the battery-backup system and the power supply system;
an identifying module, stored in memory, that identifies the rechargeable battery;
an estimating module, stored in memory, that estimates an age of the rechargeable battery;
a calculating module, stored in memory, that calculates, based at least in part on the age of the rechargeable battery, a pulse parameter for pulse charging the rechargeable battery;
a charging module, stored in memory, that instructs, via the communication channel, the battery charger of the power supply system to pulse charge the rechargeable battery using the pulse parameter to prolong the useful life of the rechargeable battery, wherein the pulse parameter is transferred from the battery-backup system to the battery charger of the power supply system via the communication channel; and
at least one processor that executes the identifying module, the estimating module, the calculating module, and the charging module.

15. The battery-backup system of claim 14, wherein the estimating module estimates the age of the rechargeable battery based at least in part on at least one of:
a nominal capacity of the rechargeable battery; or a measured capacity of the rechargeable battery that was measured when the rechargeable battery was manufactured.

16. The battery-backup system of claim 14, wherein the estimating module estimates the age of the rechargeable battery by:
  measuring a present capacity of the rechargeable battery; and
  using the present capacity of the rechargeable battery to estimate the age of the rechargeable battery.

17. The battery-backup system of claim 14, further comprising a register that is accessible to the battery charger via the communication channel, wherein:
  the charging module instructs the battery charger to pulse charge the rechargeable battery using the pulse parameter by:
    writing a value indicating the pulse parameter to the register; and
    issuing, via the communication channel, a command to the battery charger to charge the rechargeable battery; and
  the battery charger charges the rechargeable battery in response to the command by:
    reading, via the communication channel, the value indicating the pulse parameter from the register; and
    charging the rechargeable battery using the pulse parameter.

18. The battery-backup system of claim 14, wherein the rechargeable battery comprises a lithium-ion battery.

19. A rechargeable-battery apparatus comprising:
  a rechargeable battery used by a power supply system of a data-center rack, wherein:
    the power supply system uses the rechargeable battery to provide backup power to computing components of the data-center rack during non-instantaneous transitions between a primary power source and an auxiliary power source;
    the rechargeable-battery apparatus and the power supply system are separate and distinct systems that are independently controlled;
    the power supply system comprises a battery charger; and
    a communication channel is established between the rechargeable-battery apparatus and the power supply system; and
  a battery-management subsystem that:
    estimates an age of the rechargeable battery;
    calculates, based at least in part on the age of the rechargeable battery, a pulse parameter for pulse charging the rechargeable battery; and
    instructs, via the communication channel, the battery charger to pulse charge the rechargeable battery using the pulse parameter to prolong the useful life of the rechargeable battery, wherein the pulse parameter is transferred from the rechargeable-battery apparatus to the battery charger of the power supply system via the communication channel.

20. The rechargeable-battery apparatus of claim 19, further comprising a register that is accessible to the battery charger, wherein:
  the battery-management subsystem instructs the battery charger to pulse charge the rechargeable battery using the pulse parameter by:
    writing a value indicating the pulse parameter to the register; and
    issuing, via the communication channel, a command to the battery charger to charge the rechargeable battery; and
  the battery charger charges the rechargeable battery in response to the command by:
    reading, via the communication channel, the value indicating the pulse parameter from the register; and
    pulse charging the rechargeable battery using the pulse parameter.

\* \* \* \* \*

UNITED STATES PATENT AND TRADEMARK OFFICE
CERTIFICATE OF CORRECTION

PATENT NO. : 10,491,025 B1
APPLICATION NO. : 15/654553
DATED : November 26, 2019
INVENTOR(S) : Soheil Ebrahimzadeh Page 1 of 1

It is certified that error appears in the above-identified patent and that said Letters Patent is hereby corrected as shown below:

In the Claims

In Column 12, Line 46 (approx.), Claim 14, delete ":" and insert -- ; --, therefor.

Signed and Sealed this
Twenty-first Day of January, 2020

Andrei Iancu
*Director of the United States Patent and Trademark Office*